United States Patent [19]

Madden

[11] Patent Number: 4,540,229

[45] Date of Patent: Sep. 10, 1985

[54] ELECTRICAL INTERCONNECTION APPARATUS

[75] Inventor: James J. Madden, Naperville, Ill.

[73] Assignee: AT&T Bell Laboratories, Murray Hill, N.J.

[21] Appl. No.: 367,365

[22] Filed: Apr. 12, 1982

[51] Int. Cl.³ .............................................. H01R 13/54
[52] U.S. Cl. .............................. 339/75 M; 324/158 F; 324/158 P
[58] Field of Search ............ 339/75 R, 75 M, 75 MP, 339/17 C; 324/73 PC, 158 F, 158 P

[56] References Cited

U.S. PATENT DOCUMENTS

| | | | |
|---|---|---|---|
| 2,982,883 | 5/1961 | Gordy | 339/17 C |
| 3,571,780 | 3/1971 | Boenning et al. | 339/75 M X |
| 3,883,207 | 5/1975 | Tomkiewicz | 339/75 |
| 3,906,363 | 9/1975 | Fowler | 324/158 F |
| 3,950,059 | 4/1976 | Anhalt et al. | 339/75 M |
| 4,377,318 | 3/1983 | Long | 339/75 M |
| 4,423,376 | 12/1983 | Byrnes et al. | 324/158 P |

FOREIGN PATENT DOCUMENTS 2553710 6/1977 Fed. Rep. of Germany ... 324/158 F

*Primary Examiner*—Z. R. Bilinsky
*Attorney, Agent, or Firm*—Ross T. Watland; William H. Kamstra

[57] ABSTRACT

Apparatus for interconnecting a printed wiring board (10) and an electrical module carrying board (50) with zero insertion force. Conductors (15) permanently connected to the PWB (10) and extending substantially at right angles therefrom, pass freely through insulative actuator plate means (20, 21) and then extend freely through the plated-through holes (52, 53) of the module board (50). Manually operable cam means (37, 46, 49, 33, 35) are provided which cause opposite lateral movement of the actuator plate means (20, 21). The actuator plate means (20, 21) in turn act against the conductors (15) to cause their flexure into electrical contact with the walls of the plated-through holes (52, 53) of the module board (50).

3 Claims, 3 Drawing Figures

ELECTRICAL INTERCONNECTION APPARATUS

TECHNICAL FIELD

This invention relates to electrical interconnection apparatus and particularly to such apparatus for permitting the removable interconnection of modular electrical circuit components on electrical circuit boards and the like with zero installation force.

BACKGROUND OF THE INVENTION

The interconnection of individual electrical circuit components and printed wiring boards, for example, has until recently been accomplished by the well-known method of soldering the component leads to the board wiring. Although effective electrical connections were thus achieved, the soldering operations were time consuming and, further, created connections which were more or less permanent. Replacement of a defective component or the substitution of a component, for example, necessitated the unsoldering of the component leads thus adding to the cost of circuit maintenance and repair. This problem has been aggravated with the advent of large-scale integrated circuit packs having groups of many, closely spaced terminals. To meet the problem and obviate the necessity of soldering large number of terminals and at the same time permit the ready replacement of electrical components, socket connectors have been provided. Such connectors have contact receptacles in which component terminals may be inserted, the connector contacts then being permanently soldered to the circuit wiring board. Although the socket connectors offer the obvious advantage of plug-in connection of circuit packs or other components and thereby facilitate component replacement, the connectors in turn present other problems.

Insertion of the terminals of an electrical component in the receptacles of a socket connector is generally accomplished against spring action, which action must be sufficient to ensure positive electrical contact. When many terminals are involved, which is typically the case, considerable force may be required to insert the many terminals in the corresponding receptacles of the connector. Since the terminals are small and fragile, the insertion force required leaves the terminals vulnerable to bending, misalignment, and other damage to the contact surfaces. The risk of damage, of course, is present on each replacement occasion and the exercise of considerable care has been required to ensure proper seating of the electrical component terminals.

The foregoing insertion force problem has led to the development of so-called zero insertion force connectors. In these connectors, the electrical contact forces on the component terminals are not fully applied until the terminals are completely or nearly completely inserted in their receptacles. The terminals may thus be freely inserted in the connector receptacles without danger of damage. In a number of prior art zero insertion force arrangements such as that disclosed in U.S. Pat. No. 3,883,207 of T. K. Tomkiewicz issued May 13, 1975, for example, the socket connector is adapted to receive the terminals of a single integrated circuit pack such as a dual in-line pack. When a number of such circuit packs or modules are to be electrically interconnected with a circuit board, a corresponding number of individual socket connectors must also be provided as intermediate elements. This manifestly adds to the not inconsiderable cost of providing the zero insertion force mechanisms of the socket connectors themselves. It is accordingly an objective of the present invention to simplify the zero insertion force mechanism while at the same time making possible the employment of a single mechanism to simultaneous interconnect a plurality of electrical circuit modules with a printed wiring board.

SUMMARY OF THE INVENTION

The foregoing and other objectives are realized in one illustrative electrical interconnection apparatus according to the principles of the invention in which a main printed wiring board (PWB) is provided which has a rectangular array of flexible electrical conductors extending at right angles outwardly therefrom. The conductors are permanently connected by soldering, say, to the circuits of the PWB. The array of conductors extend freely through a corresponding array of plated-through apertures of an auxiliary board having a plurality of electrical circuit modules permanently affixed thereto. The auxiliary board, which is mounted substantially parallel to the main board, is provided with printed wiring connecting the module leads and the plated-through apertures.

The zero insertion force mechanism is mounted between the two boards and comprises an actuator plate also having an array of apertures corresponding to the array of conductors through which apertures the latter conductors are also freely passed. A cam means is provided which, when manually rotated, acts upon the actuator plate to cause its lateral movement. As a result, the conductors of the array are flexed into positive electrical contact with the electrical platings of the apertures of the auxiliary board. A reversal of the cam again frees the conductors thereby permitting ready removal of the auxiliary board and its replacement.

BRIEF DESCRIPTION OF THE DRAWING

The features of a zero insertion force electrical interconnection apparatus according to the invention will be better understood from a consideration of the detailed description of the organization and operation of one illustrative embodiment thereof which follows when taken in conjunction with the accompanying drawings in which.

DETAILED DESCRIPTION

Figure 1:
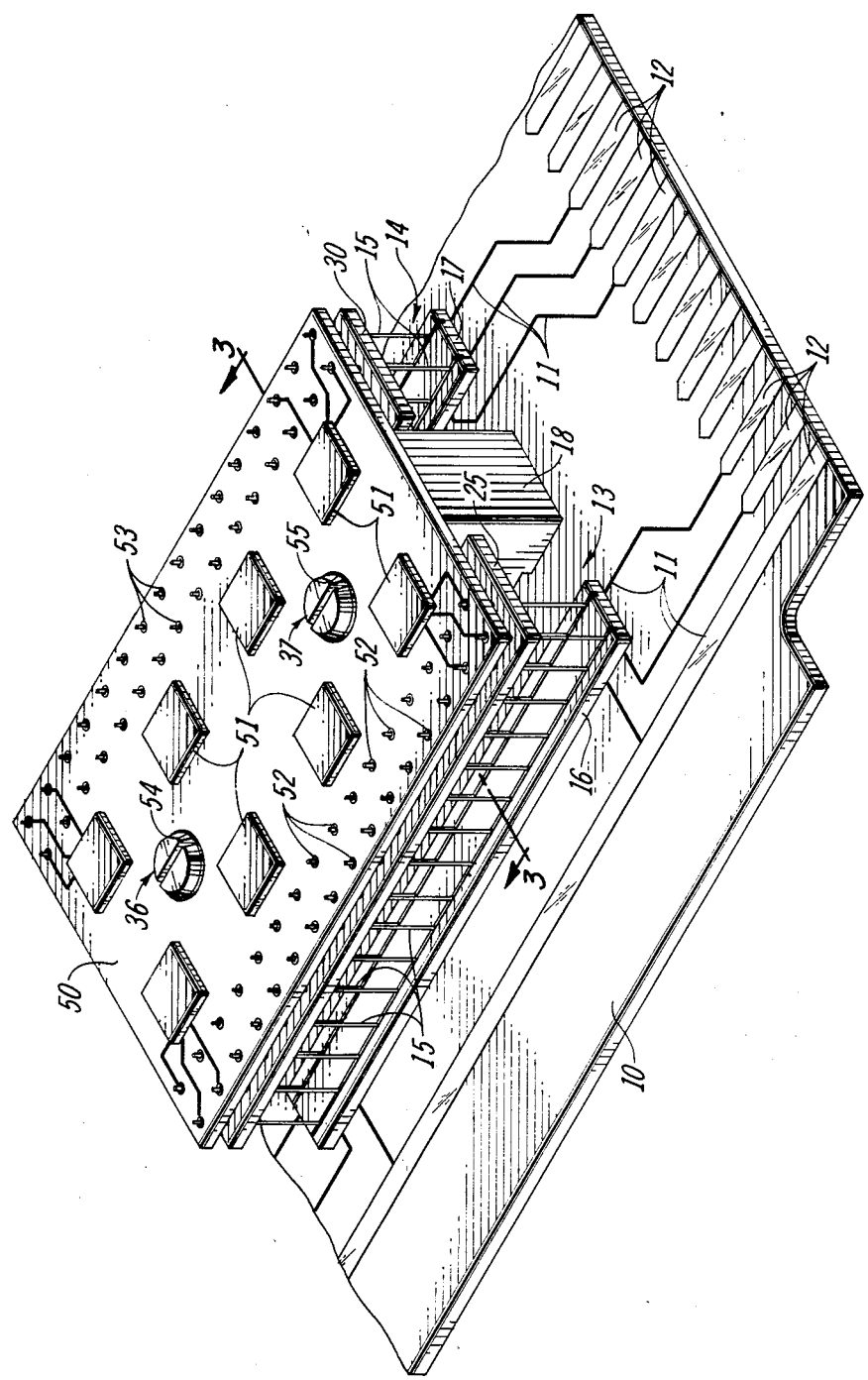
FIG. 1 shows in perspective view the entire assembly of the interconnection apparatus according to the invention.

The general configuration of one illustrative electrical interconnection assembly of the apparatus according to the invention is shown in perspective view in FIG. 1 in its state before the operation of its zero insertion force mechanism not visible in the figure. A main printed wiring board (PWB) 10, which may be considered a base for the assembly, has affixed thereto conventional printed wiring 11, representative ones of which are shown, which wiring 11 also conventionally extends at the first ends to terminals 12 at the leading edge of board 10. At the other ends, wiring 11 is connected to a first and second array 13 and 14 of flexible electrical conductors 15. Conductors 15 extend outwardly from main board 10 at substantially right angles and are permanently connected to board 10 and its wiring 11 in any convenient manner such as by soldering (see also FIG. 3). A pair of insulative spacer blocks 16 and 17 affixed to board 10 and through which conductor arrays 13 and 14 are passed, ensure precise alignment of the latter arrays.

Figure 2:
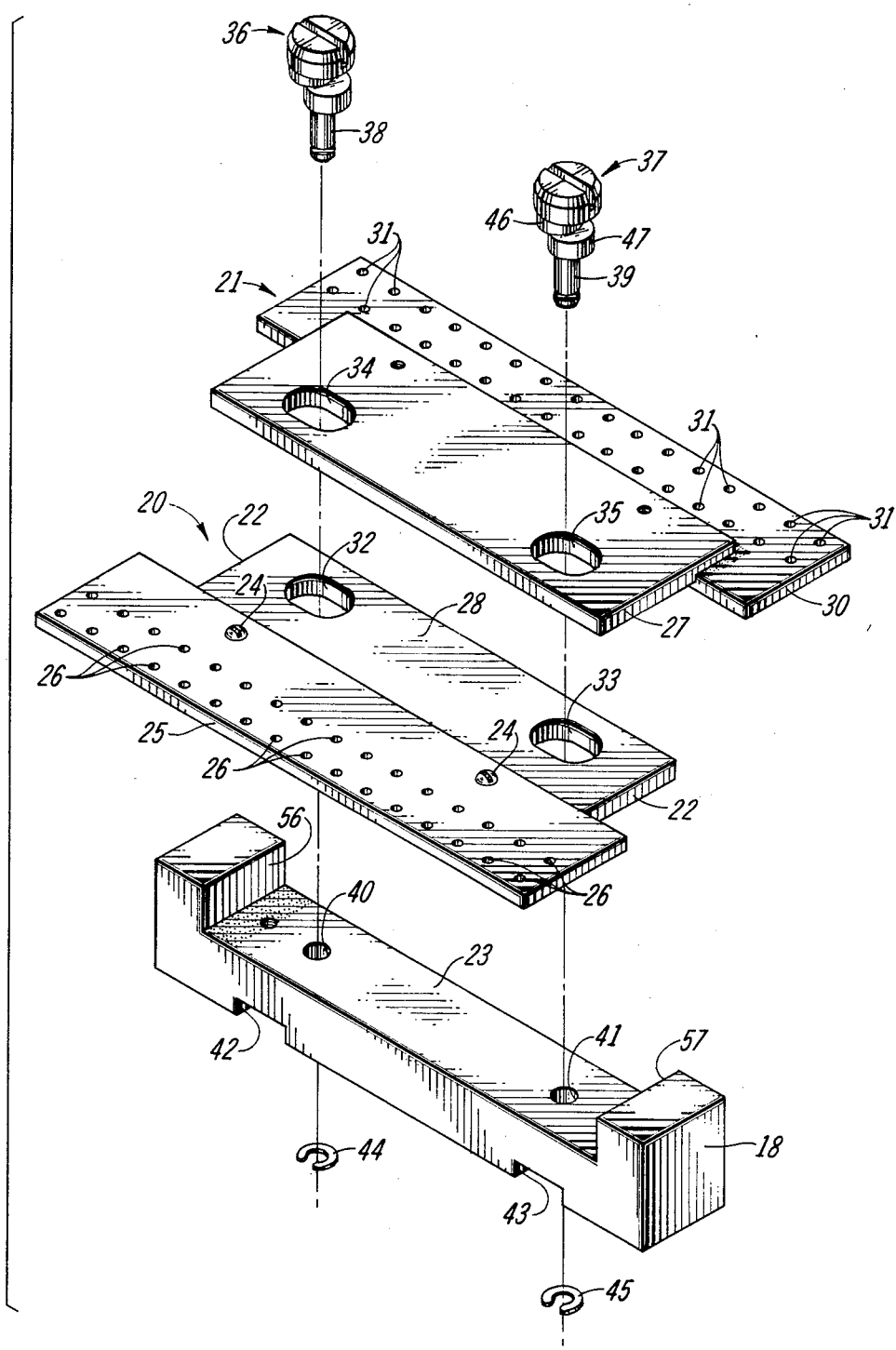
FIG. 2 shows in exploded view the details of the zero insertion force mechanism of the interconnection apparatus of the invention.
Figure 3:
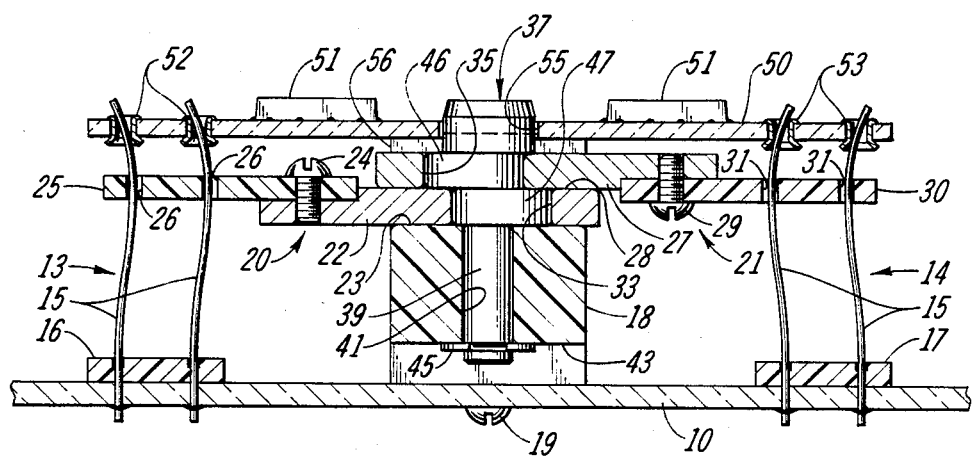
FIG. 3 is a cross-sectional, somewhat enlarged, view of the interconnection apparatus of FIG. 1 taken along the line 3—3 in the direction indicated, the apparatus being shown in its operated mode.

The novel zero insertion force mechanism featured in the apparatus, better seen in FIGS. 2 and 3, comprises as a first element an insulative support block 18 affixed to the upper surface of board 10 between the conductor arrays 13 and 14 in any convenient manner such as by screw means 19. For each conductor array 13 and 14, an actuator plate means 20 and 21 is respectively provided. Actuator plate means 20 comprises a cam plate 22 formed of any suitable metal or durable material, a lower surface of which is slidably adapted to ride on an upper surface 23 of support block 18. Affixed to cam plate 22 is any convenient manner such as by screws 24 (FIG. 3) is an insulative conductor capturing plate 25. Plate 25 is formed to provide an array of apertures 26 corresponding to the array 13 of conductors 15 through which apertures 26 conductors 15 are freely extended. Similarly, actuator plate means 21 comprises a cam plate 27 again formed of any suitable metal or durable material, a lower surface of which is slidably adapted to ride on the upper surface 28 of cam plate 22. Affixed to cam plate 27 in any convenient manner such as by screws 29 (FIG. 3) is a second insulative conductor capturing plate 30. Plate 30 is also formed to provide an array of apertures 31 corresponding to the array 14 of conductors 15, through which apertures 31 conductors 15 are freely extended.

Actuator plate means 20 and 21 are positioned in the assembly so that, as indicated hereinbefore, cam plates 22 and 27 are arranged in an overlapping relationship, the lower surface of one being slidably moveable on the upper surface of the other (FIG. 3). Also as seen in FIG. 3, in order to maintain the corresponding surfaces of conductor capturing plates 25 and 30 in the same planes, plate 25 is affixed to an inset upper surface of cam plate 22 while plate 30 is affixed to an inset lower surface of plate 27. Plates 22 and 27 have pairs of slotted, equally spaced apertures 32, 33, and 34, 35, respectively, formed therein which apertures pairs are in alignment in the unoperated assembled state of the mechanism. The assembly so far described is held together by a pair of capped pins 36 and 37 (FIG. 2) which extend, respectively, through aperture pairs 34, 32, and 35, 33 of plates 27 and 22, the caps of the pins riding on the upper surface of plate 27. Stems 38 and 39 of pins 36 and 37 are rotatably fitted in holes 40 and 41 provided therefor in supporting block 18 and extend therethrough into recesses 42 and 43, respectively, formed in the lower surface of block 18. At this point, pins 36 and 37 are secured in place by snap-lock washers 44 and 45 conventionally fitted in annular slots formed at the ends of pin stems 38 and 39. Each of pins 36 and 37 (see pin 37) is formed to present between its cap and its stem 39 a pair of circular cam lobes 46 and 47 the central axes of which lie on opposite sides of the longitudinal axis of the pin. The upper and lower cam lobes, e.g., lobes 46 and 47 of pins 36 and 37, are dimensioned to operate freely on the side walls of slotted apertures 34, 32, and 35, 33, respectively. (See operated assembled view of FIG. 3). The caps of pins 36 and 37 may be slotted to receive a screwdriver blade.

The zero-insertion force mechanism so far described is adapted to receive an auxiliary module board 50 having a plurality of electrical circuit modules 51 permanently affixed thereto. Modules 51 are conventionally connected by printed wiring to the plated-through holes 52 and 53 of two arrays of such holes corresponding in positions to the arrays 13 and 14, respectively, of electrical conductors 15. Board 50 has two apertures 54 and 55 formed therein dimensioned to freely accept the caps of pins 36 and 37, respectively, (FIG. 3). Auxiliary board 50 is fitted to the zero insertion force mechanism of the invention by fitting its plated-through holes, 52 and 53, freely about conductors 15 of conductor arrays 13 and 14, the caps of pins 36 and 37 extending through its apertures 54 and 55. The lower surface of board 50 then rests on the surfaces of two end pedestals 56 and 57 of supporting block 18. In its unoperated state, the rotational positions of pins 36 and 37 are such that the central axes of their cam lobes and the longitudinal axes of the pins lie on a straight line. In these positions, slotted apertures pairs 34, 32, and 35, 33 of plates 27 and 22 are in substantial alignment and conductors 15 are freely fitted in the arrays of plated-through holes of capturing plates 25 and 30. Positive electrical contact between the conductors 15 and the plated-through holes is made by rotating pins 36 and 37 90 degrees in any convenient manner, such as by a screwdriver, in a counter-clockwise direction as viewed downward in the figures of the drawing. As a result, the upper cam lobes of pins 36 and 37 cause an inward lateral movement of cam plate 27 and its attached conductor capturing plate 30. At the same time, the lower cam lobes of pins 36 and 37 cause an inward lateral movement of cam plate 22 and its attached capturing plate 25. Conductors 15 of arrays 13 and 14 are thereby flexed inwardly, their ends brought firmly into contact with the inner walls of the plated-through holes. (FIG. 3). The cumulative pressure thus asserted by conductors 15 on the walls of holes 52 and 53 also securely holds board 50 in the interconnection assembly. The 90 degree rotation of the cam lobes of pins 36 and 37 leaves the lobes asserting forces on plates 22 and 27 at right angles to a line between the centers of aperture pairs 32, 33 and 34, 35 thereby securely locking the mechanism in its operated slate. Auxiliary board 50 is released by rotating pins 36 and 37 in a reverse direction thereby freeing conductor 15 and permitting removal of board 50 without risk of damage to the conductors or the plated-through holes.

What has been described is considered to be only one specific electrical interconnection apparatus according to the principles of the invention. Accordingly, it is to be understood that various and numerous other arrangements may be devised by one skilled in the art without departing from the spirit and scope of the invention as defined by the accompanying claims.

What is claimed is:

1. Electrical interconnection apparatus for removably connecting a plurality of circuit modules to a first electrical circuit board having printed wiring affixed on a surface thereof comprising
    a second electrical circuit board in substantially parallel, spaced-apart relation to said first board, said second board having said plurality of modules permanently affixed thereto and having a first and a second array of plated-through apertures in electrical connection with said plurality of modules,
    a first and a second array of flexible conductors electrically connected to the printed wiring of said first board, said arrays of conductors permanently attached to and extending outwardly from said first board to pass freely through said first and second array of apertures, respectively, a first and a second insulative actuator plate laterally operable on said first and second array of conductors, respectively, for flexing said conductors of each of said arrays of conductors into electrical contact with said plated-through apertures of said first and second array of plated-through apertures, respectively, said first and second actuator plates each being spaced apart from said first board and from said second board such that said arrays of conductors are flexed but not deformed by the operation of said first and second actuator plates, each of said actuator plates having a slot formed therein in alignment with a slot in the other plate, and cam means rotatable in said slots for laterally moving said actuator plates.

2. Electrical interconnection apparatus as claimed in claim 1 in which said first and second actuator plates are mounted between said first and second electrical circuit boards and are adapted for movement in substantially opposite directions for flexing said first and second array of conductors, respectively, in substantially opposite directions to securely hold said first board in place.

3. Electrical interconnection apparatus as claimed in claim 2 in which each of said actuator plates has an array of apertures therein freely fitted, respectively, about said conductors of said first and second array of conductors.

* * * * *